United States Patent
Kim et al.

(10) Patent No.: US 12,237,693 B2
(45) Date of Patent: Feb. 25, 2025

(54) WIRELESS POWER TRANSMITTING DEVICE, WIRELESS POWER RECEIVING DEVICE, AND METHOD OF OPERATING THE SAME

(71) Applicant: SAMSUNG ELECTRONICS CO., LTD., Suwon-si (KR)

(72) Inventors: Dongzo Kim, Suwon-si (KR); Mincheol Ha, Suwon-si (KR); Taehyeon Yu, Suwon-si (KR); Kyungmin Lee, Suwon-si (KR); Kihyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/190,675

(22) Filed: Mar. 27, 2023

(65) Prior Publication Data
US 2023/0412001 A1 Dec. 21, 2023

Related U.S. Application Data

(63) Continuation of application No. PCT/KR2023/003601, filed on Mar. 17, 2023.

(30) Foreign Application Priority Data

Jun. 15, 2022 (KR) .................. 10-2022-0073048
Jul. 12, 2022 (KR) .................. 10-2022-0085599

(51) Int. Cl.
*H02J 50/12* (2016.01)
*H02J 50/80* (2016.01)
*H02M 1/00* (2007.01)

(52) U.S. Cl.
CPC .............. *H02J 50/12* (2016.02); *H02J 50/80* (2016.02); *H02M 1/0077* (2021.05)

(58) Field of Classification Search
CPC ........ H02J 50/12; H02J 50/80; H02M 1/0077; H02M 3/01; H02M 3/33573; H02M 3/33584
See application file for complete search history.

(56) References Cited

U.S. PATENT DOCUMENTS 11,063,636 B2  7/2021  Park et al.
11,355,971 B2  6/2022  Youn et al.
(Continued)

FOREIGN PATENT DOCUMENTS

JP   2006100979 A   4/2006
KR   20120128545 A   11/2012
(Continued)

OTHER PUBLICATIONS

Search Report dated Jun. 26, 2023 in counterpart International Patent Application No. PCT/KR2023/003601.
(Continued)

*Primary Examiner* — Jared Fureman
*Assistant Examiner* — Michael J Warmflash
(74) *Attorney, Agent, or Firm* — Nixon & Vanderhye, P.C.

(57) ABSTRACT

An example wireless power transmitter may include a transmission coil, a converter configured to output a driving voltage, an inverter configured to output AC power to the transmission coil using the driving voltage, and a controller. The controller may be configured to identify a first voltage at one point within the wireless power transmitter while power is wirelessly transmitted through the transmission coil. The controller may be configured to perform at least one operation for providing a first packet for reduction in modulation depth of a wireless power receiver to the wire- (Continued)

less power receiver based on a peak-to-peak value identified to be larger than a first reference value according to the first voltage.

16 Claims, 12 Drawing Sheets

(56) References Cited

U.S. PATENT DOCUMENTS

| | | | |
|---|---|---|---|
| 11,595,083 B2 | 2/2023 | Park | |
| 11,912,143 B2 | 2/2024 | Partovi | |
| 2017/0117741 A1* | 4/2017 | Lee | H04B 5/79 |
| 2017/0126066 A1* | 5/2017 | Von Novak, III | H04B 5/72 |
| 2019/0079815 A1* | 3/2019 | Cader | F01P 7/14 |
| 2020/0119578 A1* | 4/2020 | O | H02M 7/5387 |
| 2022/0033351 A1* | 2/2022 | Piper | C25B 15/081 |
| 2022/0072611 A1* | 3/2022 | Swartz | C22C 47/025 |
| 2022/0149658 A1* | 5/2022 | O. | H02J 50/10 |
| 2023/0032332 A1* | 2/2023 | Whitehill | A61B 5/746 |
| 2023/0063671 A1* | 3/2023 | Song | H02J 50/10 |

FOREIGN PATENT DOCUMENTS

| | | |
|---|---|---|
| KR | 10-2014-0082823 | 7/2014 |
| KR | 10-2016-0063004 | 6/2016 |
| KR | 10-1730236 | 4/2017 |
| KR | 10-1936180 | 1/2019 |
| KR | 20190079815 A | 7/2019 |
| KR | 10-2021-0066838 | 6/2021 |
| KR | 10-2022-0033351 | 3/2022 |
| KR | 10-2022-0072611 | 6/2022 |
| KR | 10-2023-0032332 | 3/2023 |
| WO | 2019/160351 | 8/2019 |
| WO | 2020/085614 | 4/2020 |

OTHER PUBLICATIONS

Written Opinion dated Jun. 26, 2023 in counterpart International Patent Application No. PCT/KR2023/003601.

* cited by examiner

| | $b_7$ | $b_6$ | $b_5$ | $b_4$ | $b_3$ | $b_2$ | $b_1$ | $b_0$ |
|---|---|---|---|---|---|---|---|---|
| $B_0$ | (MSB) | | Major Version | | | | Minor Version | |
| $B_1$ | | | | Manufacturer Code | | | | |
| $B_2$ | | | | | | | | (LSB) |

| | $b_7$ | $b_6$ | $b_5$ | $b_4$ | $b_3$ | $b_2$ | $b_1$ | $b_0$ |
|---|---|---|---|---|---|---|---|---|
| $B_0$ | Power Class | | | Guaranteed Power Value | | | | |
| $B_1$ | Reserved | | | Potential Power Value | | | | |
| $B_2$ | Reserved | | | | | | WPID | Not Res Sens |

| Header | Packet Types | Message Size |
|---|---|---|
| Negotiation phase | | |
| 0x00 | Power Transmitter Data Not Available | 1 |
| 0x1E | Proprietary | 1 |
| 0x1F | Proprietary | 1 |
| 0x2E | Proprietary | 2 |
| 0x2F | Proprietary | 2 |
| 0x30 | Power Transmitter Identification | 3 |
| 0x31 | Power Transmitter Capability | 3 |
| 0x3F | Proprietary | 3 |
| 0x4F | Proprietary | 4 |
| 0x5E | Proprietary | 5 |
| 0x6F | Proprietary | 6 |
| 0x7F | Proprietary | 7 |
| 0x8F | Proprietary | 9 |

FIG. 8

WIRELESS POWER TRANSMITTING DEVICE, WIRELESS POWER RECEIVING DEVICE, AND METHOD OF OPERATING THE SAME

CROSS-REFERENCE TO RELATED APPLICATIONS

This application is a continuation of International Application No. PCT/KR2023/003601, designating the United States, filed on Mar. 17, 2023, in the Korean Intellectual Property Receiving Office and claiming priority to Korean Patent Application No. 10-2022-0073048 filed on Jun. 15, 2022 in the Korean Intellectual Property Office and to Korean Patent Application No. 10-2022-0085599 filed on Jul. 12, 2022 in the Korean Intellectual Property Office. The disclosures of each of these applications are incorporated by reference herein in their entireties.

BACKGROUND

Field

The disclosure relates to an apparatus for wireless transmitting power, an apparatus for wirelessly receiving power, and a method of operating the same.

Description of Related Art

Wireless power transmission technology using a magnetic induction scheme is a scheme of transmitting power using an electromagnetic field generated on a coil, and a wireless power transmission device (e.g., a wireless power transmitter) may apply the current to a transmission coil to generate an electromagnetic field for inducing an electromotive force on a reception coil of a wireless power reception device (e.g., a wireless power receiver), so that power can be wirelessly transmitted.

The wireless power transmission device may perform in-band communication while wirelessly transmitting power to the wireless power reception device. For example, the wireless power transmission device may perform in-band communication based on a frequency shift keying (FSK) modulation scheme. The wireless power reception device may perform in-band communication while wirelessly receiving power from the wireless power transmission device. The wireless power reception device may provide information to the wireless power transmission device by performing the in-band communication. For example, the wireless power reception device may perform in-band communication based on an amplitude shift keying (ASK) modulation scheme. At least one additional element may be selectively connected to a resonant circuit of the wireless power reception device through a switch, and the wireless power reception device may perform modulation by controlling an on/off state of the switch. Amplitude of the current and/or voltage applied to the transmission coil of the wireless power transmission device may be changed according to modulation in the wireless power reception device. The wireless power transmission device may identify information provided by the wireless power reception device by demodulating and/or decoding information on the amplitude of the current and/or voltage applied to the transmission coil.

SUMMARY

According to an example embodiment, a wireless power transmission device (e.g., a wirelesss power transmitter) for wirelessly transmitting power to a wireless power reception device (e.g., a wireless power receiver) may include a transmission coil, a converter configured to output a driving voltage, an inverter configured to output AC power to the transmission coil using the driving voltage, and a controller. The controller may be configured to identify a first voltage at one point within the wireless power transmission device while power is wirelessly transmitted through the transmission coil. The controller may be configured to perform at least one operation for providing a first packet for reduction in modulation depth of the wireless power reception device to the wireless power reception device based on a peak-to-peak value being identified to be larger than a first reference value based on the first voltage.

According to an example embodiment, a method of operating a wireless power transmission device (e.g., a wireless power transmitter) for wirelessly transmitting power to a wireless power reception device (e.g., a wireless power receiver) may include an operation of providing a driving voltage to an inverter of the wireless power transmission device by a converter of the wireless power transmission device. The method may include an operation of allying AC power to a transmission coil of the wireless power transmission device by the inverter using the driving voltage. The method may include an operation of identifying a first voltage at one point within the wireless power transmission device while the power is wirelessly transmitted through the transmission coil. The method may include an operation of performing at least one operation for providing a first packet for reduction in modulation depth of the wireless power reception device to the wireless power reception device, based on a peak-to-peak value identified to be larger than a first reference value, based on the first voltage.

According to an example embodiment, a non-transitory computer-readable recording medium storing instructions configured to perform at least one operation by a controller of a wireless power transmission device (e.g., a wireless power transmitter) for wirelessly transmitting power to a wireless power reception device (e.g., a wireless power receiver) may include an operation of providing a driving voltage to an inverter of the wireless power transmission device by a converter of the wireless power transmission device. The at least one operation may include an operation of applying AC power to a transmission coil of the wireless power transmission device by the inverter using the driving voltage The at least one operation may include an operation of identifying a first voltage at one point within the wireless power transmission device while the power is wirelessly transmitted through the transmission coil. The at least one operation may include an operation of performing at least one operation for providing a first packet for reduction in modulation depth of the wireless power reception device to the wireless power reception device, based on a peak-to-peak value identified to be larger than a first reference value, based on the first voltage.

BRIEF DESCRIPTION OF THE DRAWINGS

The above and/or other aspects of the disclosure will be more apparent by describing certain embodiments of the disclosure with reference to the accompanying drawings, in which:

FIGS. 3A-1, 3A-2, 3A-3, and 3A-4 are diagrams illustrating signals according to the control of switches corresponding to modulation capacitors in an example wireless power reception device according to an embodiment;

FIG. 4 is a diagram illustrating expansion and contraction of capacitors of an example wireless power transmission device and an example wireless power reception device according to an embodiment;

FIG. 8 is a diagram illustrating a packet of an example wireless power transmission system according to an embodiment.

DETAILED DESCRIPTION

Figure 1:
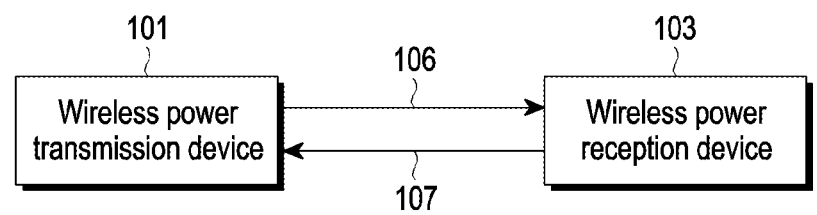
FIG. 1 is a block diagram illustrating an example wireless power transmission device and an example wireless power reception device according to an embodiment.

FIG. 1 is a block diagram illustrating an example wireless power transmission device (e.g., a wireless power transmitter) and an example wireless power reception device (e.g., a wireless power receiver) according to an embodiment.

Figure 9:
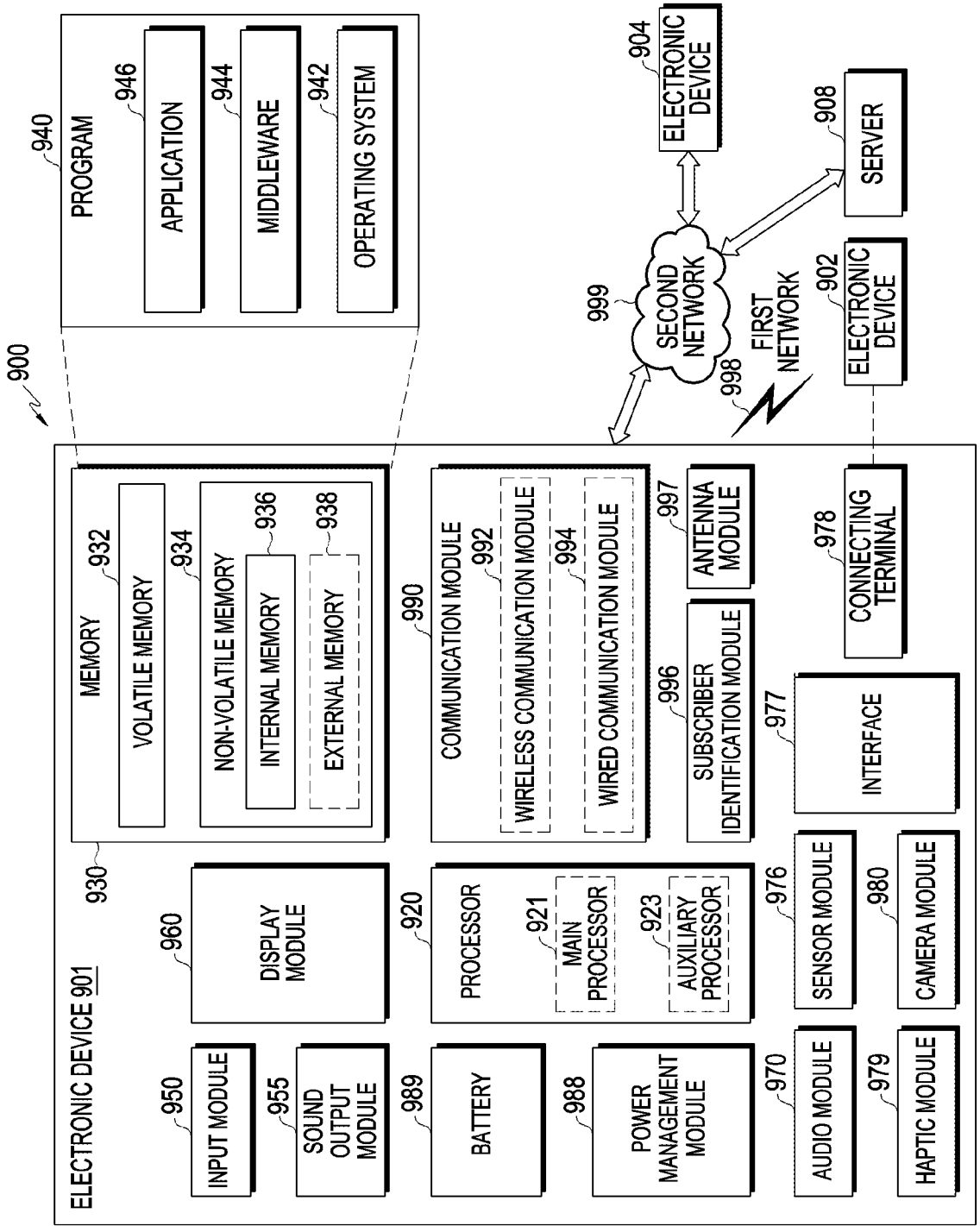
FIG. 9 is a block diagram of an example electronic device within a network environment according to embodiments.

Referring to FIG. 1, a wireless power transmission device 101 (for example, an electronic device 902 of FIG. 9) according to an embodiment may wirelessly transmit power to a wireless power reception device 103 (for example, an electronic device 901 of FIG. 9). Alternatively, the wireless power transmission device 101 may receive information 107 from the wireless power reception device 103. In an example embodiment, the wireless power transmission device 101 may transmit power 106 according to an induction scheme. When the wireless power transmission device 101 is based on the induction scheme, the wireless power transmission device 101 may include at least one of, for example, a power source, a DC-DC converting circuit (for example, a DC/DC converter), an a DC-AC converting circuit (for example, an inverter), an amplification circuit, an impedance matching circuit, at least one capacitor, at least one coil, or a communication modulation circuit. The at least one capacitor may configure a resonance circuit with the at least one coil. The wireless power transmission device 101 may implement at least a part of the scheme defined in the wireless power consortium (WPC) Qi standard. When current flows according to the induction scheme, the wireless power transmission device 101 may include a coil for generating an induced magnetic field. An operation in which the wireless power transmission device 101 generates an induced magnetic field may be expressed as wireless transmission of the power 106 by the wireless power transmission device 101. Further, on the coil of the wireless power reception device 103, induced electromotive force (or current, voltage, and/or power) may be generated by the magnetic field generated around thereof according to a resonance scheme or the induction scheme. A process of generating the induced electromotive force through the coil may be expressed as wireless reception of the power 106 by the wireless power reception device 103.

The wireless power transmission device 101 according to an embodiment may communicate with the wireless power reception device 103. For example, the wireless power transmission device 101 may communicate with the wireless power reception device 103 according to an in-band scheme. The wireless power transmission device 101 may modulate data to be transmitted according to, for example, a frequency shift keying (FSK) modulation scheme, and the wireless power reception device 103 may perform modulation according to an amplitude shift keying (ASK) modulation scheme to provide the information 107. The wireless power transmission device 101 may identify the information 107 provided by the wireless power reception device 103 based on amplitude of the current and/or voltage applied to the transmission coil. FIG. 1 illustrates that the wireless power reception device 103 directly transmits the information 107 to the wireless power transmission device 101, but this arrangement is only for easy understanding. It may be understood that the wireless power reception device 103 controls on/off of at least one switch therein. An operation of performing modulation based on the ASK modulation scheme and/or the FSK modulation scheme may be understood as an operation of transmitting data (or packets) according to an in-band communication scheme, and an operation of performing demodulation based on an ASK demodulation scheme and/or an FSK demodulation scheme may be understood as an operation of receiving data (or packets) according to an in-band communication scheme.

In an embodiment, the performance of a specific operation by the wireless power transmission device 101 or the wireless power reception device 103 may be the performance of the specific operation by various hardware, for example, a controller (for example, a micro controlling unit (MCU), a field programmable gate array (FPGA), an application specific integrated circuit (ASIC), a micro processor, or an application processor (AP)) included in the wireless power transmission device 101 or the wireless power reception device 103. The performance of a specific operation by the wireless power transmission device 101 or the wireless power reception device 103 may refer, for example, to the controller controlling other hardware to perform the specific operation. The performance of a specific operation by the wireless power transmission device 101 or the wireless power reception device 103 may refer, for example, to causing the controller or other hardware to perform the specific operation according to execution of at least one instruction for performing the specific operation stored in a storage circuit (for example, a memory) of the wireless power transmission device 101 or the wireless power reception device 103.

Figure 2:
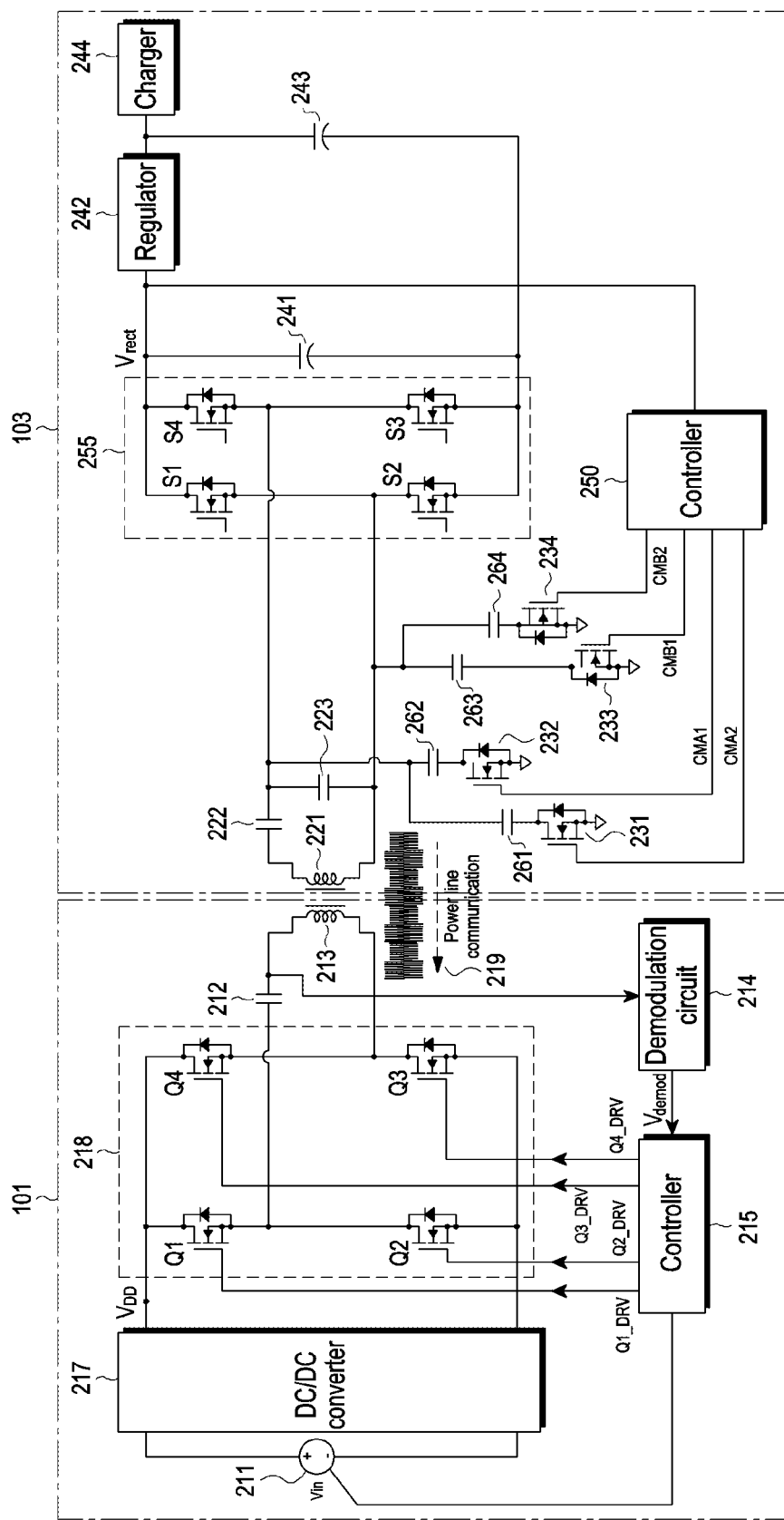
FIG. 2 is a block diagram illustrating an example wireless power transmission device and an example wireless power reception device according to an embodiment.
Figures 1, 3A:
Figures 2, 3A:
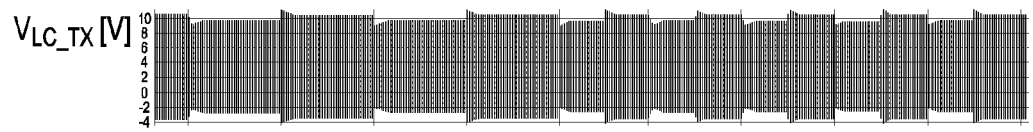
Figures 3, 3A:
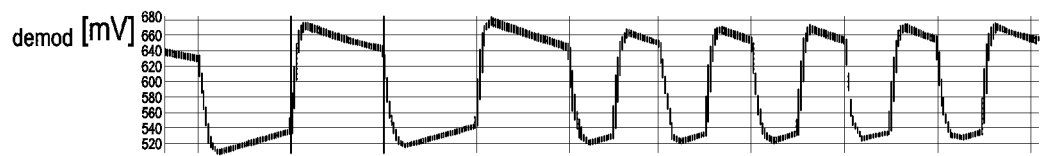
Figures 3, 3A, 4:
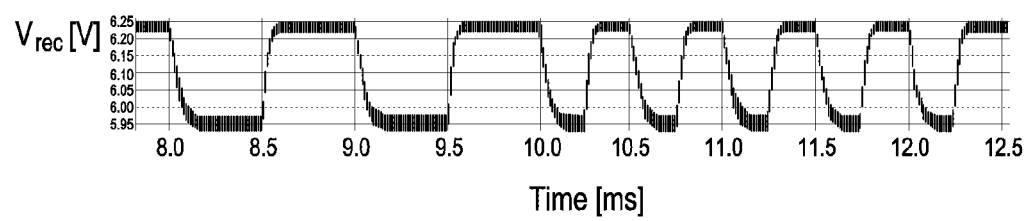
Figure 3B:
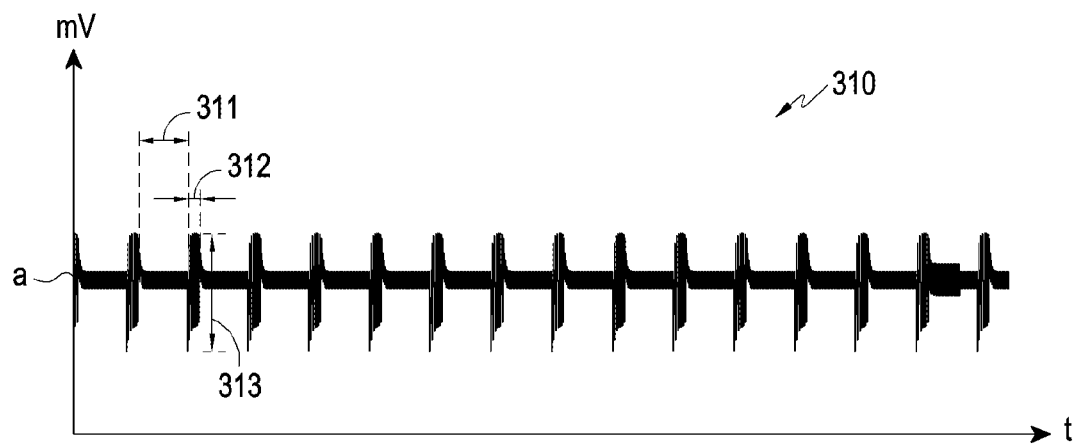
FIG. 3B is a diagram illustrating a demodulated voltage identified by demodulation of a signal in a transmission coil of an example wireless power transmission device.
Figure 3C:
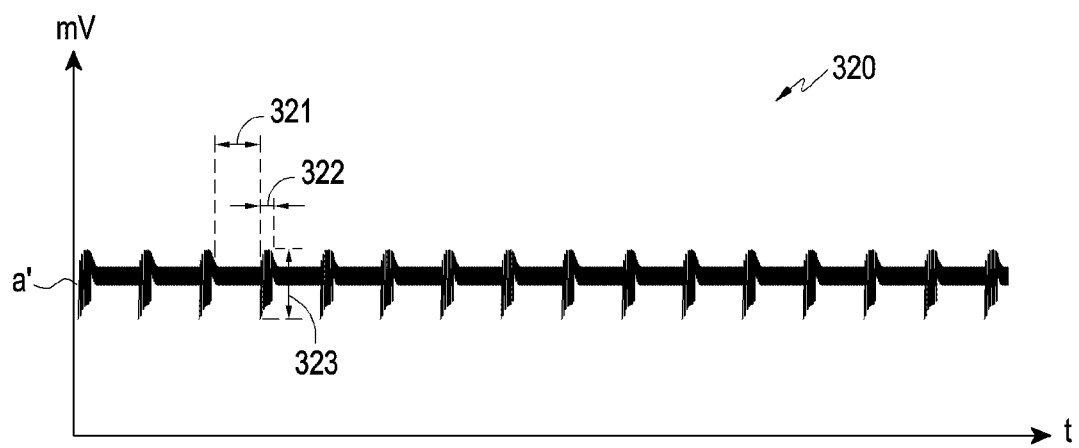
FIG. 3C is a diagram illustrating a demodulated voltage identified by demodulation of a signal in a transmission coil of an example wireless power transmission device.
Figure 4:
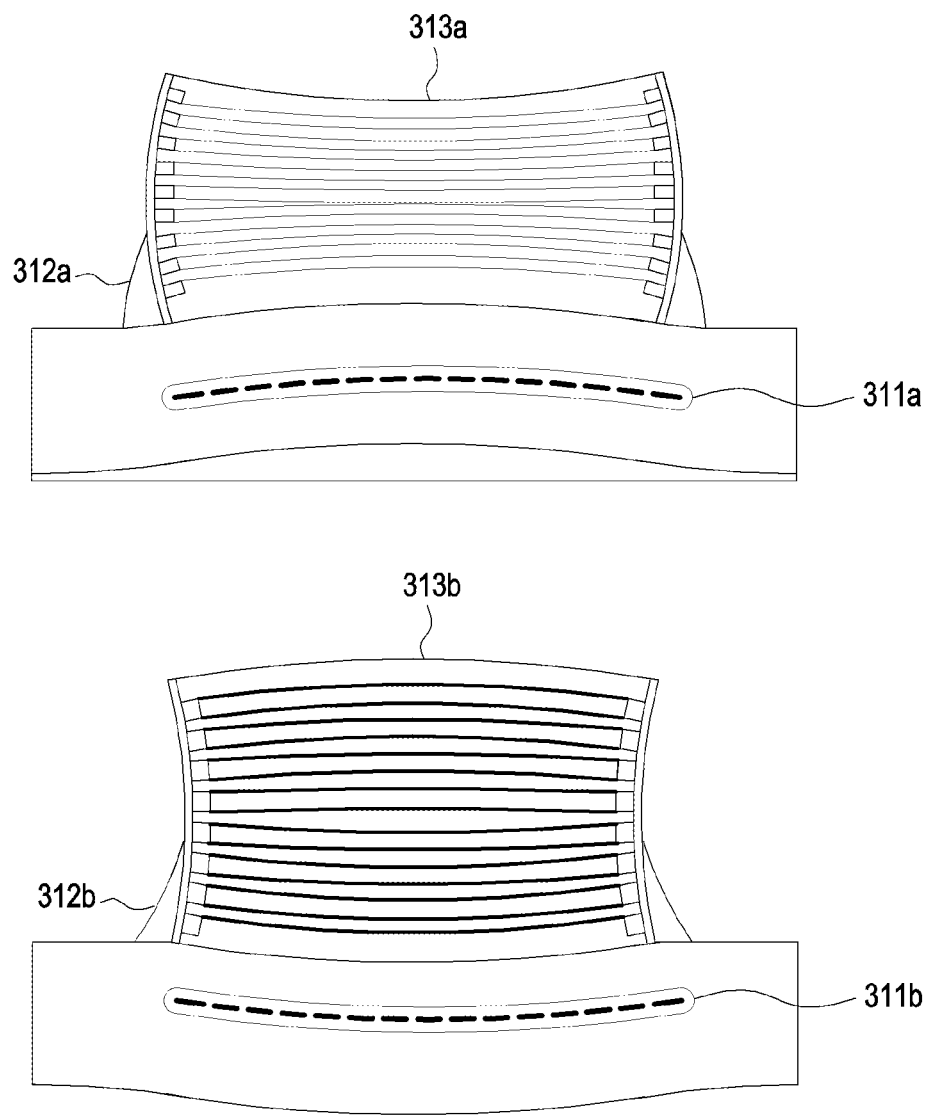

FIG. 2 is a block diagram illustrating an example wireless power transmission device and an example wireless power reception device according to an embodiment. The example embodiment of FIG. 2 may be described with reference to FIGS. 3A-1, 3A-2, 3A-3, 3A-4, 3B, 3C, and FIG. 4. FIG. 3A is a diagram illustrating signals according to the control of switches corresponding to modulation capacitors in the wireless power reception device according to an embodiment. FIGS. 3B and 3C are diagrams illustrating the demodulated voltage identified by demodulation of a signal in the transmission coil of the wireless power transmission device according to an embodiment. FIG. 4 is a diagram illustrating expansion and contraction of capacitor in an example wireless power transmission device and an example wireless power reception device according to an embodiment.

According to an embodiment, the wireless power transmission device 101 may include at least one of a power source 211, an inverter 218 including a plurality of switches (for example, a first switch Q1, a second switch Q2, a third switch Q3, and a fourth switch Q4), a capacitor 212, a transmission coil 213, a demodulation circuit 214, a controller 215, or a DC/DC converter 217.

According to an embodiment, power provided by the power source 211 may be provided to the DC/DC converter 217. The power source 211 may include at least one of an interface to be connected to an external travel adapter (TA), a battery (not shown) of the wireless power transmission device 101, a charger (not shown), or a power management integrated circuit (PMIC) (not shown). The power source 211 may provide, for example, DC power to the DC/DC converter 217, but there is no limit in the form of provided power. The DC/DC converter 217 may convert the voltage of the provided power and provide the same to the inverter 218. The DC/DC converter 217 may change the voltage of the input DC power and provide the DC power having the changed voltage (or driving voltage (VDD)) to the inverter 218. The DC/DC converter 217 may perform, for example, buck converting and/or boost converting, and may be implemented as, for example, a 3-level converter, but it will be understood by those skilled in the art that there is no limit in the type thereof.

The inverter 218 according to an embodiment may output AC power using the driving voltage (VDD) provided from the DC/DC converter 217. The inverter 218 may include a plurality of switches (for example, the first switch Q1, the second switch Q2, the third switch Q3, and the fourth switch Q4). The plurality of switches (for example, the first switch Q1, the second switch Q2, the third switch Q3, and the fourth switch Q4) may configure, for example, a full bridge circuit, but there is no limit in the number of switches or the type of the bridge circuit. For example, the plurality of switches may include the first switch Q1, the second switch Q2, the third switch Q3, and the fourth switch Q4. For example, when a full bridge circuit is configured, one end of the transmission coil 213 may be connected to a connection point between the first switch Q1 and the second switch Q2 through the capacitor 212, and the other end of the transmission coil 213 may be connected to a connection point between the third switch Q3 and the fourth switch Q4. The plurality of switches (for example, the first switch Q1, the second switch Q2, the third switch Q3, and the fourth switch Q4) may be controlled to be in an on state or an off state. For example, in order to generate AC power, the controller may control the first switch Q1 and the third switch Q3 to be in the on state and the second switch Q2 and the fourth switch Q4 to be in the off state during a first period, and control the first switch Q1 and the third switch Q3 to be in the off state and the second switch Q2 and the fourth switch Q4 to be in the on state during a second period, and may repeatedly perform the control operations. The controller 215 may provide control signals (Q1_DRV, Q2_DRV, Q3_DRV, and Q4_DRV) for generating the AC power to the plurality of switches (for example, the first switch Q1, the second switch Q2, the third switch Q3, and the fourth switch Q4). The controller 215 may refrain from performing an operation of providing at least one of the control signals (Q1_DRV, Q2_DRV, Q3_DRV, and Q4_DRV). For example, the output of a first control signal for generating AC power having a first frequency to the inverter 218 by the controller 215 may refer, for example, to the controller 215 outputting control signals (Q1_DRV and Q3_DRV) for controlling the first switch Q1 and the third switch Q3 to be in the on state during a period corresponding to the first frequency, outputting control signals (Q2_DRV and Q4_DRV) for controlling the second switch Q2 and the fourth switch Q4 to be in the on state during a period corresponding to the first frequency, and repeating the output operations. Meanwhile, the output of a second control signal for generating AC power having a second frequency to the inverter 218 by the controller 215 may refer, for example, to the controller 215 outputting control signals (Q1_DRV and Q3_DRV) for controlling the first switch Q1 and the third switch Q3 to be in the on state during a period corresponding to the second frequency, outputting control signals (Q2_DRV and Q4_DRV) for controlling the second switch Q2 and the fourth switch Q4 to be in the on state during a period corresponding to the second frequency, and repeating the output operations, in which case the period corresponding to the second frequency may be different from the period corresponding to the first frequency.

According to an embodiment, the AC power generated by the inverter 218 may be applied to the transmission coil 213. The capacitor 212 may configure a resonant circuit with the transmission coil 213. The transmission coil 213 may configure or generate a magnetic field based on the applied AC power. Some of the magnetic field (or magnetic flux) configured by the transmission coil 213 may pass through a cross section of a reception coil 221 of the wireless power reception device 103. According to a change in the magnetic field passing through the cross section of the reception coil 221 as time goes by, induced electromotive force (for example, current, voltage, or power) may be generated in the reception coil 221.

According to an embodiment, the demodulation circuit 214 may demodulate the signal applied to the transmission coil 213 (for example, the voltage 219 applied to both ends of the transmission coil 213) and output a demodulation signal ($V_{demod}$). The demodulation circuit 214 may down-convert, for example, the signal applied to the transmission coil 213 (for example, the voltage 219 at both ends) by a frequency of the AC power (for example, 100 to 210 kHz) and output the demodulation signal ($V_{demod}$). For example, the demodulation circuit 214 may include a mixer and/or a multiplier circuit for removing, for example, a carrier component (for example, the frequency of 100 to 210 kHz of the AC power) for wireless power transmission. Here, since mixed waveforms of a component by modulation of the wireless power reception device 103 and an AC power component by the wireless power transmission device 101 may be applied to both ends of the coil 213 of the wireless power transmission device 101, the frequency component (for example, 100 to 210 kHz) of the AC power may be named a carrier component, and it may be understood by those skilled in the art that the wireless power reception device 103 does not actually generate an electromagnetic wave obtained by mixing the modulated data and the carrier. Accordingly, the carrier component (for example, the frequency of 100 to 210 kHz of the AC power) may be removed from the voltage 219 at both ends of the transmission coil 213. The demodulation circuit 214 may additionally filter (low pass filter) the demodulation signal ($V_{demod}$) to output the same. The demodulation circuit 214 may include a low pass filter. In an embodiment, after filtering the voltage 219 at both ends of the transmission coil 213, the demodulation circuit 214 may down-convert the voltage by the frequency (for example, 100 to 210 kHz) of AC power and generate the demodulation signal ($V_{demod}$). Amplitude of the voltage 219 at both ends of the transmission coil 213 may be changed according to ASK modulation of the wireless power reception device 103. According to an embodiment, the controller 215 may identify information provided by the wireless power reception device 103 based on the demodulation signal ($V_{demod}$) output by the demodulation circuit 214. The controller 215 may perform analog-to-digital (ADC) converting on, for example, the demodulation signal ($V_{demod}$). The controller 215 may decode a digital value acquired by the ADC result and identify information provided by the wireless power reception device 103 according to the decoding result. A decoding scheme may follow, for example, the Qi standard, but it may be understood by those skilled in the art that there is no limitation in this regard. Meanwhile, it is described that the demodulation circuit 214 performs frequency down conversion (for example, carrier removal) and/or low pass filtering and the controller 215 performs ADC and/or decoding in the above-described embodiment, but this is only an example. It may be understood by those skilled in the art that the demodulation circuit 214 may be implemented to further perform at least one of the ADC or the decoding according to an embodiment and the controller 215 may be implemented to further perform the frequency down conversion (for example, carrier removal) and/or the low pass filtering.

According to an embodiment, the wireless power reception device 103 may include at least one of a reception coil 221, a capacitor 222, a capacitor 223, a rectification circuit 255, a controller 250, a plurality of capacitors (for example, a first capacitor 261, a second capacitor 262, a third capacitor 263, and a fourth capacitor 264), a plurality of switches (for example, a first switch 231, a second switch 232, a third switch 233, and a fourth switch 234), a capacitor 241, a regulator 242, a capacitor 243, or a charger 244. For example, the plurality of capacitors may include the first capacitor 261, the second capacitor 262, the third capacitor 263, and the fourth capacitor 264, but there is no limit in the number of capacitors. For example, the plurality of switches may include the first switch 231, the second switch 232, the third switch 233, and the fourth switch 234, but there is no limit in the number of switches.

According to an embodiment, the reception coil 221, the capacitor 222, and the capacitor 223 may configure a resonant circuit. One end of the capacitor 222 may be connected to the reception coil 221, and the other end of the capacitor 222 may be connected to one end of the capacitor 223 and one end of the rectification circuit 255. One end of the capacitor 223 may be connected to the other end of the capacitor 222, and the other end of the capacitor 223 may be connected to the other end of the reception coil 221. For example, the capacitor 223 may be connected in parallel to a circuit configured by a series connection of the reception coil 221 and the capacitor 222. The other end of the capacitor 223 may be connected to the other end of the rectification circuit 255.

According to an embodiment, the rectification circuit 255 may include a plurality of switches (for example, a fifth switch S1, a sixth switch S2, a seventh switch S3, and an eighth switch S4) configuring a full bridge circuit. For example, the plurality of switches may include the fifth switch S1, the sixth switch S2, the seventh switch S3, and the eighth switch S4. One end of the resonant circuit may be connected to a connection point between the fifth switch S1 and the sixth switch S2, and the other end of the resonant circuit may be connected to a connection point between the seventh switch S3 and the eighth switch S4. The rectification circuit 255 may convert the AC power received through the reception coil 221 into DC power. The controller 250 may control on/off states of the plurality of switches (for example, the fifth switch S1, the sixth switch S2, the seventh switch S3, and the eighth switch S4) to convert the AC power to the DC power.

According to an embodiment, the capacitor 241 and the regulator 242 may be connected to the rectification circuit 255. One end of the capacitor 241 may be grounded. The regulator 242 may perform converting (for example, buck converting and/or boost converting) and/or regulating of the voltage of the rectified power output from the power conversion circuit.

According to an embodiment, the charger 244 may charge a battery (not shown) using the power converted and/or regulated by the regulator 242. According to an embodiment, the charger 244 may control the voltage and/or the current in order to charge the battery according to a battery charging mode (for example, a constant current (CC) mode, a constant voltage (CV) mode, or a quick charging mode). According to an embodiment, a PMIC (not shown) instead of the charger 244 may be connected to the regulator 242.

According to an embodiment, the controller 250 may perform modulation in accordance with information to be provided. The controller 250 may determine a capacitor to perform modulation among the plurality of capacitors (for example, the first capacitor 261, the second capacitor 262, the third capacitor 263, and the fourth capacitor 264). According to the capacitor to perform modulation, difference in amplitude of the voltage 219 sensed by the wireless power transmission device 101 may be changed. For example, when the modulation is performed by only one first capacitor 261, it is assumed that difference in amplitude of the voltage 219 sensed by the wireless power transmission device 101 (for example, difference between maximum amplitude of the voltage 219 during the on state of the first switch 231 and maximum amplitude of the voltage 219 during the off state of the first switch 231) is a first value. In this case, since the second capacitor 262, the third capacitor 263, and the fourth capacitor 264 are not used for the modulation, the second switch 232, the third switch 233, and the fourth switch 234 may be maintained in the off state. Meanwhile, when the modulation is performed by the first capacitor 261 and the second capacitor 262, difference in amplitude of the voltage 219 sensed by the wireless power transmission device 101 (for example, difference between maximum amplitude of the voltage 219 during the on states of the first switch 231 and the second switch 232 and maximum amplitude of the voltage 219 during the off states of the first switch 231 and the second switch 232) is a second value which may be larger than the first value. In this case, since the third capacitor 263 and the fourth capacitor 264 are not used for the modulation, the third switch 233 and the fourth switch 234 may be maintained in the off state. The wireless power reception device 103 may control a modulation degree (or modulation depth) by controlling the capacitor(s) to perform modulation among the plurality of capacitors (for example, the first capacitor 261, the second capacitor 262, the third capacitor 263, and the fourth capacitor 264). As described above, the controller 250 may output at least some of the control signals (CMA1, CMA2, CMB1, and CMB2) and/or refrain from making the output to maintain the off state of switches corresponding to capacitors which have not been determined while performing modulation using the determined capacitors. Meanwhile, capacitance of the second capacitor 262 may be smaller than capacitance of the first capacitor 261 and capacitance of the fourth capacitor 264 may be smaller than capacitance of the third capacitor 263, but it is only an example, and there is no limit in sizes of the capacitances and the sizes may be the same.

As described above, there may be difference in amplitude of the voltage 219 in the transmission coil 213 (for example, difference between maximum amplitude during the on state of at least one switch in the wireless power reception device 103 and maximum amplitude during the off state) according to modulation in the wireless power reception device 103. The difference in amplitude of the voltage 219 in the transmission coil 213 due to modulation may cause a change in the voltage applied to the capacitors included in the wireless power transmission device 101. For example, the application of a voltage having a constant value to the capacitor to which the DC voltage is applied is preferable, but the voltage applied to the corresponding capacitor may be changed according to modulation of the wireless power reception device 103. For example, FIG. 3A-1 illustrates control signals (CMA1, CMA2, CMB1, and CMB2) for controlling the plurality of switches (for example, the first switch 231, the second switch 232, the third switch 233, and the fourth switch 234), output from the controller 250 when all of the plurality of switches (for example, the first switch 231, the second switch 232, the third switch 233, and the fourth switch 234) are selected in the wireless power reception device 103 of FIG. 2. For modulation, the control signals (CMA1, CMA2, CMB1, and CMB2) may be or may not be applied. FIG. 3A-2 illustrates the voltage ($V_{LC\_TX}$) at both ends of the transmission coil 213. As illustrated in FIG. 3A-2, the voltage ($V_{LC\_TX}$) at both ends of the transmission coil 213 is an AC waveform and may have a frequency (for example, 100 to 210 kHz) of AC power provided by the inverter 218. Meanwhile, it may be identified that there is difference between a maximum amplitude of the voltage ($V_{LC\_TX}$) while the control signals (CMA1, CMA2, CMB1, and CMB2) are applied and a maximum amplitude of the voltage ($V_{LC\_TX}$) while the control signals (CMA1, CMA2, CMB1, and CMB2) are not applied. FIG. 3A-3 illustrates an output signal ($V_{demod}$) of the demodulation circuit 214. FIG. 3A-4 illustrates the voltage ($V_{rec}$) (for example, $V_{rect}$ of FIG. 2) of an output terminal of the rectification circuit 255 of the wireless power reception device 103. It may be identified that there is difference between a value of the voltage ($V_{rec}$) of the output terminal of the rectification circuit 255 of the wireless power reception device 103 while the control signals (CMA1, CMA2, CMB1, and CMB2) are applied and a value while the control signals (CMA1, CMA2, CMB1, and CMB2) are not applied. Referring to FIGS. 3A-1 and 3A-2, according to repetition of on/off of the plurality of switches (for example, the first switch 231, the second switch 232, the third switch 233, and the fourth switch 234), it may be identified that maximum amplitude of the voltage ($V_{LC\_TX}$) at both ends of the transmission coil 213 is changed. Referring to FIGS. 3A-3 and 3A-4, it may be identified that the waveform of the output signal ($V_{demod}$) output by the voltage ($V_{LC\_TX}$) at both ends of the transmission coil 213 passing through the demodulation circuit 214 is similar to the waveform of the voltage ($V_{rec}$) at the output terminal of the rectification circuit 255. The controller 215 may identify information provided by the wireless power reception device 103 based on the result of processing (for example, ADC and/or decoding) of the output signal ($V_{demod}$).

Meanwhile, FIGS. 3B and 3C illustrate the demodulated voltage generated by (or output from) the demodulation circuit 214. FIG. 3B illustrates an output signal 310 in the case in which, for example, the wireless power reception device 103 selects a first group from among a plurality of capacitors (for example, the first capacitor 261, the second capacitor 262, the third capacitor 263, and the fourth capacitor 264) for modulation. As illustrated in FIG. 3B, a first part 311 of the output signal 310 is a waveform during a period in which no modulation is performed in the wireless power reception device 103 and may substantially have, for example, the size of "a". A second part 312 of the output signal 310 is a waveform during a period in which modulation is performed in the wireless power reception device 103 and a waveform change having a first peak-to-peak 313 from the size of "a" may be identified. When the second part 312 is expanded, it may be similar to, for example, the output signal ($V_{demod}$) of the demodulation circuit 214 of FIG. 3A-3. A frequency of the second part 312 may correspond to, for example, a modulation frequency (for example, 2 kHz). Like the change in amplitude of the second part 312, a voltage change in another capacitor of the wireless power transmission device 101 may be made. FIG. 3C illustrates an output signal 320 in the case in which, for example, the wireless power reception device 103 selects a second group from among the plurality of capacitors (for example, the first capacitor 261, the second capacitor 262, the third capacitor 263, and the fourth capacitor 264) for modulation. As illustrated in FIG. 3C, a first part 321 of the output signal 320 is a waveform during a period in which no modulation is performed in the wireless power reception device 103 and may substantially have, for example, the size of "a'", and "a'" may be the same as "a", but may be implemented to be different therefrom. A second part 322 of the output signal 320 is a waveform during a period in which modulation is performed in the wireless power reception device 103, and a waveform change having a second peak-to-peak 323 from the size of "a'" may be identified. It may be identified that the first peak-to-peak 313 in FIG. 3B is larger than the second peak-to-peak 323 in FIG. 3C. Meanwhile, as illustrated in FIG. 3B, a relatively larger peak-to-peak may cause contraction and expansion of a relatively larger capacitor. For example, referring to FIG. 4, according to a change in the voltage applied to the capacitor, the capacitor may be charged and discharged. The capacitor may be, for example, a capacitor disposed in a power path from the power source 211 to the transmission coil 213 (for example, a capacitor for a buffer or a capacitor for filtering) or a capacitor included in hardware (for example, the DC/DC converter), and there is no limit in the capacitor if the capacitor is included in the wireless power transmission device 101. Further, it may be understood by those skilled in the art that the description of the embodiment of FIG. 4 can be applied to the capacitor included in the wireless power reception device 103. For convenience of description, following description is made based an example of the wireless power transmission device 101. For example, the capacitor may have a first shape 313a during discharging, and the capacitor may have a second shape 313b during charging. A change in the shape according to charging and discharging of the capacitor may cause a change in the shape of neighboring hardware, for example, a PCB or solder. For example, when the capacitor has the first shape 313a, the PCB may have a first shape 311a and the solder may have a first shape 312a. For example, when the capacitor has the second shape 313b, the PCB may have a second shape 311b and the solder may have a second shape 312b. According to the change in the shape, vibration may be generated, and when a frequency of the corresponding vibration is included in an audible range (for example, 20 to 20000 Hz), audible noise may be heard by the user. Relatively larger voltage difference between charging and discharging may cause relatively larger audible noise. Since the change in the voltage of the capacitor is larger as a modulation degree of the wireless power reception device 103 is larger (for example, the number of modulation capacitors is larger), the size of audible noise may be larger. Meanwhile, the larger voltage change in the capacitor of the wireless power transmission device 101 as the larger number of modulation capacitors used by the wireless power reception device 103 is only an example, and other correlations are possible. According to an embodiment, audible noise may be generated in the wireless power reception device 103. By the modulation operation performed by the wireless power reception device 103, the voltage applied to the capacitors (for example, the first capacitor 261, the second capacitor 262, the third capacitor 263, the fourth capacitor 264, the capacitor 241, and/or the capacitor 243) may also be changed, and thus audible noise may be generated according to vibration of the capacitor.

Figure 5:
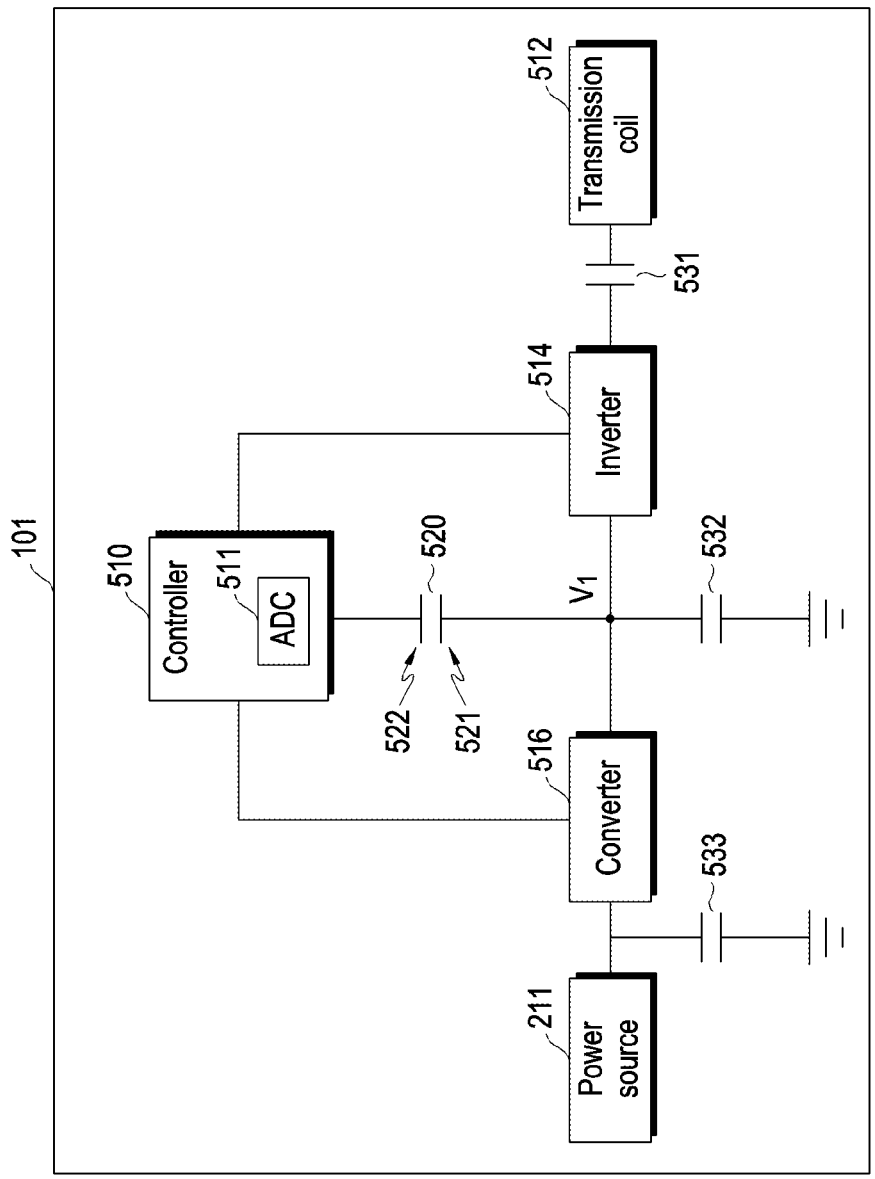
FIG. 5 is a block diagram illustrating an example wireless power transmission device according to an embodiment.

FIG. 5 is a block diagram illustrating an example wireless power transmission device according to an embodiment.

Referring to FIG. 5, the wireless power transmission device 101 according to an embodiment may include a controller 510, a transmission coil 512, an inverter 514, a converter 516, and the power source 211. The transmission coil 512 may be the transmission coil 213 of FIG. 2. The inverter 514 may be the inverter 218 of FIG. 2. The converter 516 may be the DC/DC converter 217 of FIG. 2. The controller 510 may be the controller 215 of FIG. 2. The capacitor 531 may be the capacitor 212 of FIG. 2. The wireless power transmission device 101 may include a capacitor 532 having one end connected to an input terminal of the inverter and an output terminal of the converter. The wireless power transmission device 101 may include a capacitor 533 having one end connected to an input terminal of the converter. The wireless power transmission device 101 may include a capacitor 520 having one end 521 connected to the input terminal of the inverter and the output terminal of the converter.

According to an embodiment, the controller 510 may include an analog-to-digital converter (ADC) 511. For example, the ADC 511 may be implemented as an element separated from the analog-to-digital converter (ADC) for converting the demodulation signal ($V_{demod}$) output by the demodulation circuit 214 of FIG. 2. Alternatively, according to implementation, the ADC 511 may be the analog-to-digital converter (ADC) for converting the demodulation signal ($V_{demod}$) output by the demodulation circuit 214 of FIG. 2. The ADC 511 may be electrically connected to the other end 522 of the capacitor 520. The ADC 511 may convert the voltage of the other end 522 of the capacitor 520.

Figure 6A:
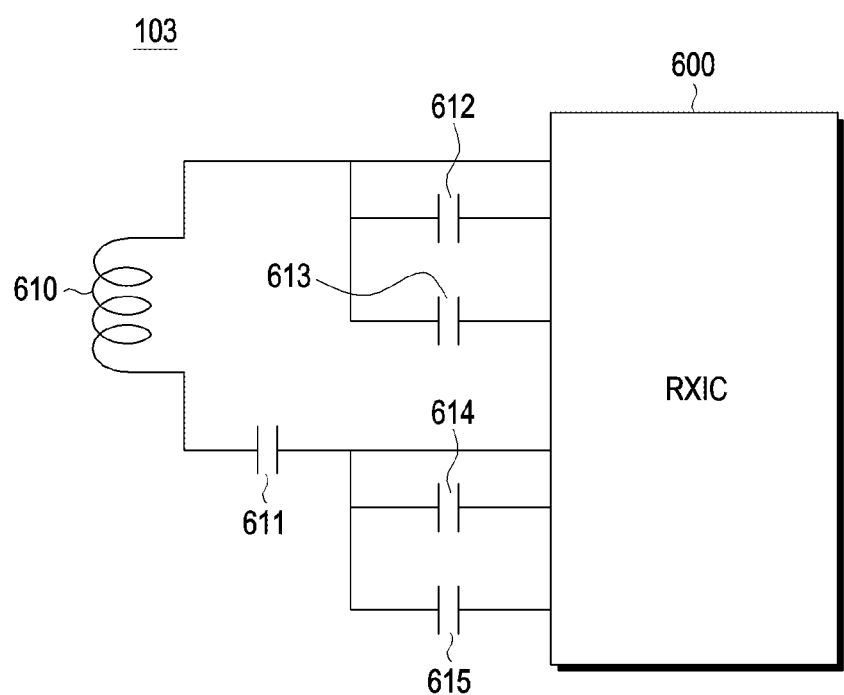
FIG. 6A is a diagram illustrating amplitude modulation of an example wireless power reception device according to an embodiment.
Figure 6B:
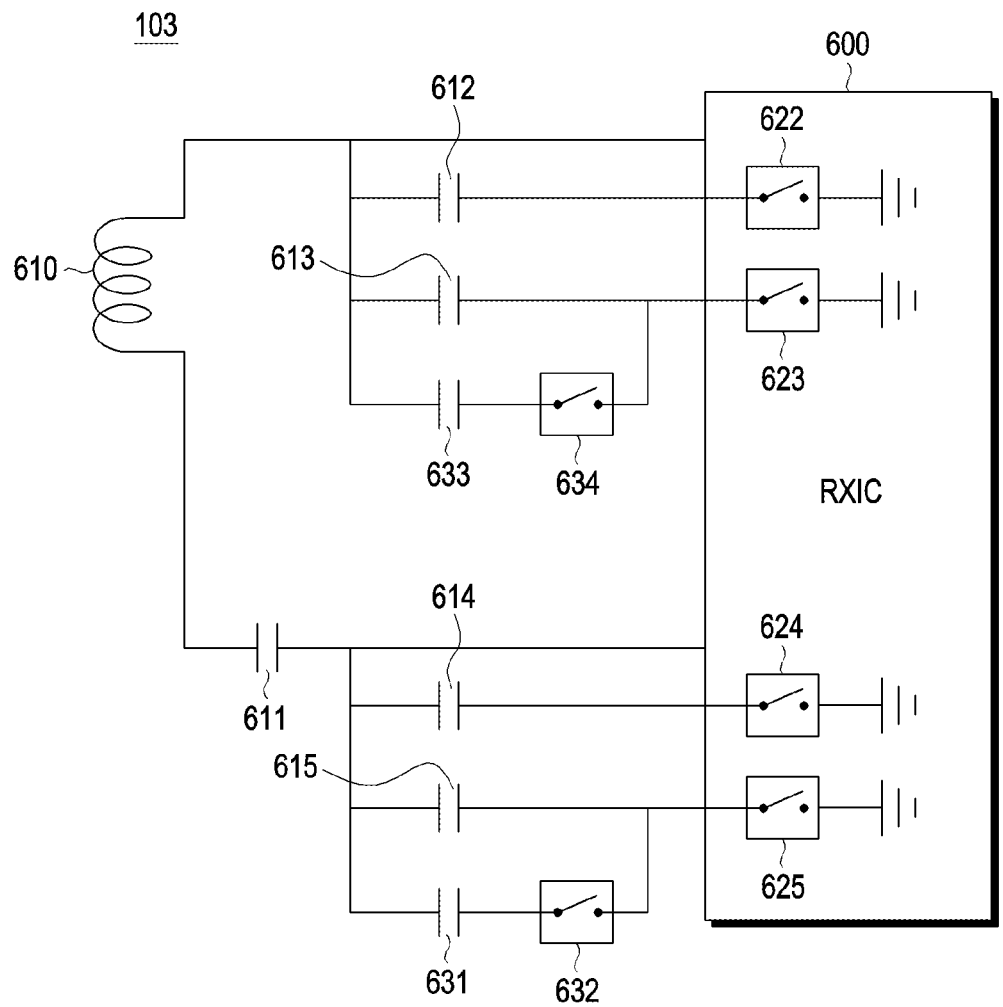
FIG. 6B is a diagram illustrating amplitude modulation of an example wireless power reception device according to an embodiment.
Figure 6C:
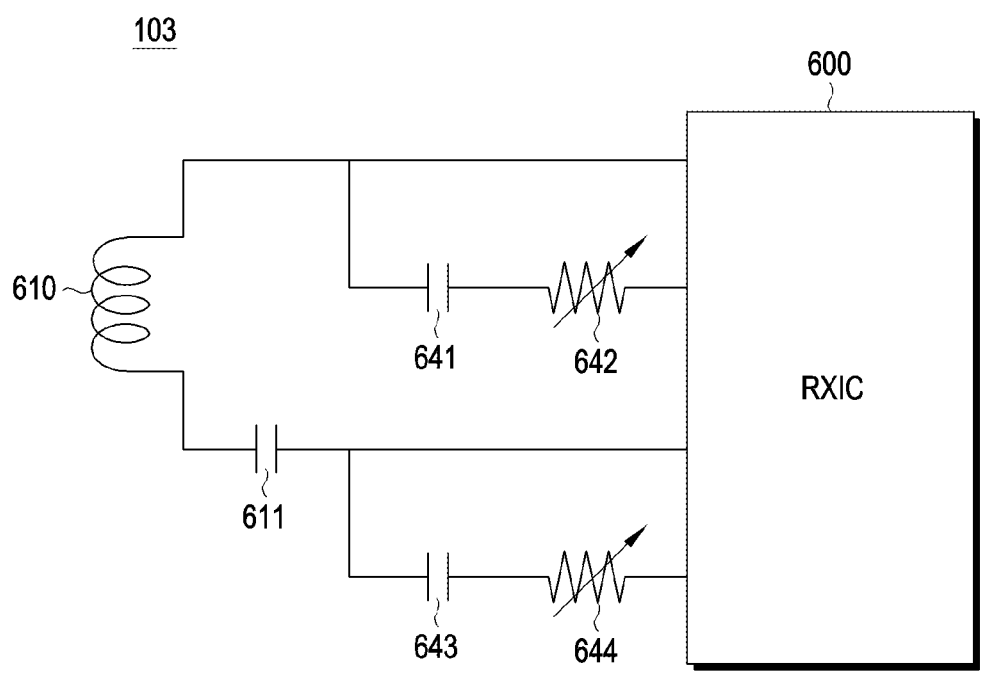
FIG. 6C is a diagram illustrating amplitude modulation of an example wireless power reception device according to an embodiment.

FIG. 6A is a diagram illustrating amplitude modulation of an example wireless power reception device according to an embodiment. FIG. 6B is a diagram illustrating amplitude modulation of an example wireless power reception device according to an embodiment. FIG. 6C is a diagram illustrating amplitude modulation of an example wireless power reception device according to an embodiment.

Referring to FIG. 6A, the wireless power reception device 103 according to an embodiment may include a reception coil 610, a capacitor 611, a first capacitor 614, a second capacitor 615, a third capacitor 612, a fourth capacitor 613, and an Rx integrated circuit (RX IC) 600. The reception coil 610 may be the reception coil 221 of FIG. 2. The capacitor 611 may be the capacitor 222 of FIG. 2. The first capacitor 614 may be the first capacitor 261 of FIG. 2. The second capacitor 615 may be the second capacitor 262 of FIG. 2. The third capacitor 612 may be the third capacitor 263 of FIG. 2. The fourth capacitor 613 may be the second capacitor 264 of FIG. 2. The RX IC 600 may be an integrated circuit including the controller 250 and the rectification circuit 255 of FIG. 2, but there is no limitation in an implementation scheme of the RX IC 600.

As illustrated in FIG. 2, the wireless power reception device 103 may control the modulation degree (or modulation depth) according to the control of the capacitor to perform modulation among the plurality of capacitors (for example, the first capacitor 614, the second capacitor 615, the third capacitor 612, and the fourth capacitor 613) in FIG. 6. As described above, the controller 250 may output at least some of the control signals (CMA1, CMA2, CMB1, and CMB2) and/or refrain from making the output to maintain the off state of switches corresponding to capacitors which have not been determined while performing modulation using the determined capacitor. There is no limit in capacitance of the plurality of capacitors (for example, the first capacitor 614, the second capacitor 615, the third capacitor 612, and the fourth capacitor 613).

According to an embodiment, the wireless power reception device 103 may control the modulation degree (or modulation depth) according to the control of the capacitor(s) to perform modulation among the plurality of capacitors (for example, the first capacitor 614, the second capacitor 615, the third capacitor 612, and the fourth capacitor 613) based on a packet received from the wireless power transmission device 101. The packet received from the wireless power transmission device 101 is described below.

Referring to FIG. 6B, the wireless power reception device 103 according to an embodiment may include the reception coil 610, the capacitor 611, the first capacitor 614, the second capacitor 615, the third capacitor 612, the fourth capacitor 613, and the Rx integrated circuit (RX IC) 600. The wireless power reception device 103 may include a third switch 622 (for example, the third switch 233) connected to the third capacitor 612. The wireless power reception device 103 may include a fourth switch 623 (for example, the fourth switch 234) connected to the fourth capacitor 613. The wireless power reception device 103 may include a first switch 624 (for example, the first switch 231) connected to the first capacitor 614. The wireless power reception device 103 may include a second switch 625 (for example, the second switch 232) connected to the second capacitor 615.

According to an embodiment, the wireless power reception device 103 may control the modulation degree (or modulation depth) by controlling states (for example, on states or off states) of the plurality of switches (for example, the first switch 624, the second switch 625, the third switch 622, and the fourth switch 623) based on the packet received from the wireless power transmission device 101.

Referring to FIG. 6B, according to an embodiment, the wireless power reception device 103 may further include a fifth capacitor 631, a fifth switch 632, a sixth capacitor 633, and a sixth switch 634. The sixth switch 634 may be connected to the sixth capacitor 633. The fifth switch 632 may be connected to the fifth capacitor 631. According to an embodiment, the sixth switch 634 may be connected to a point between the fourth capacitor 613 and the fourth switch 623 and the fifth switch 632 may be connected to a point between the second capacitor 615 and the second switch 625, but there is no limitation in points for the connection of the sixth switch 634 and the fifth switch 632.

According to an embodiment, the wireless power reception device 103 may further include the fifth capacitor 631, the fifth switch 632, the sixth capacitor 633, and the sixth switch 634, so as to expand the step of the modulation degree (or modulation depth). The wireless power reception device 103 may control the modulation degree (or modulation depth) by controlling states (for example, on states or off states) of the plurality of switches (for example, the first switch 624, the second switch 625, the third switch 622, the fourth switch 623, the fifth switch 632, and/or the sixth switch 634) based on the packet received from the wireless power transmission device 101.

Referring to FIG. 6C, the wireless power reception device 103 according to an embodiment may include the reception coil 610, the capacitor 611, a seventh capacitor 641, a first variable resistor 642, an eighth capacitor 643, a second variable resistor 644, and the Rx integrated circuit (RX IC) 600. The seventh capacitor 641 may be one of the third capacitor 263 or the fourth capacitor 264 of FIG. 2. The eighth capacitor 643 may be one of the first capacitor 261 or the second capacitor 262 of FIG. 2.

According to an embodiment, the wireless power reception device 103 may further include the first variable resistor 642 and the second variable resistor 644, so as to expand the step of the modulation degree (or modulation depth). The wireless power reception device 103 may control the modulation degree (or modulation depth) by controlling states (for example, on states or off states) of the plurality of switches (for example, the first switch 231, the second switch 232, the third switch 233, and the fourth switch 234 of FIG. 2) and resistance values of the variable resistors (for example, the first variable resistor 642 and the second variable resistor 644) based on the packet received from the wireless power transmission device 101.

Figure 7:
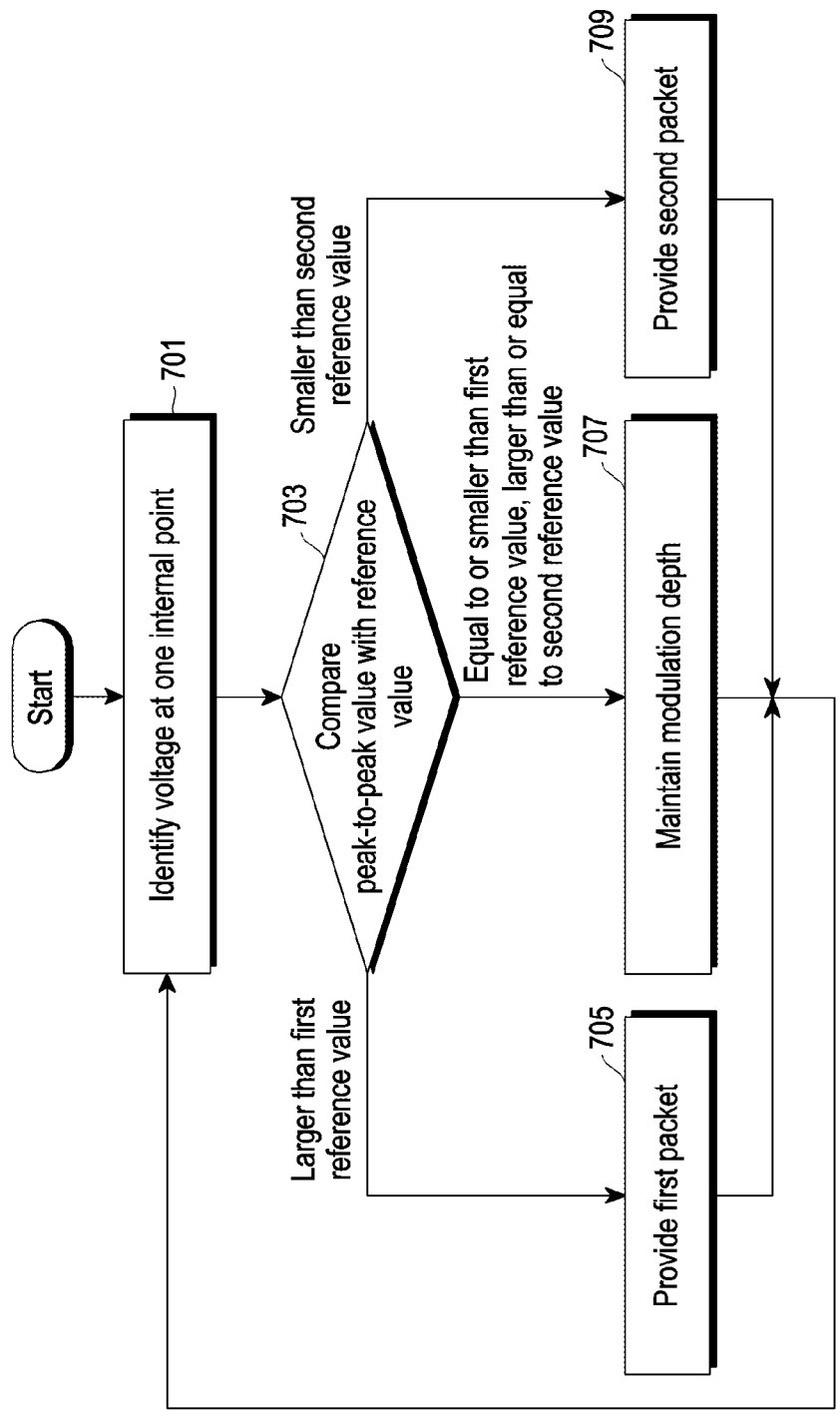
FIG. 7 is a flowchart illustrating an example method of operating an example wireless power transmission device according to an embodiment.

FIG. 7 is a flowchart illustrating an example method of operating an example wireless power transmission device according to an embodiment. FIG. 7 is described with reference to FIG. 5.

Referring to FIG. 7, in operation 701, the wireless power transmission device 101 (for example, the controller 510) may identify a voltage (for example, a first voltage) at one point within the wireless power transmission device 101 as a target voltage. The "target voltage" may, for example, refer to a voltage of which peak-to-peak is identified. The wireless power transmission device 101 may identify peak-to-peak based on the identified target voltage. The "peak-to-peak" may be difference between a maximum value and a minimum value of the target voltage.

According to an embodiment, the wireless power transmission device 101 may identify the voltage (for example, the first voltage) at the point within the wireless power transmission device 101 as the target voltage while power is wirelessly transmitted to the wireless power reception device 103 through the transmission coil 512. The wireless power transmission device 101 may identify the peak-to-peak based on the voltage (for example, the first voltage) at the point within the wireless power transmission device 101.

According to an embodiment, the wireless power transmission device 101 may identify a driving voltage provided from the converter 516 to the inverter 514 as the target voltage. For example, the wireless power transmission device 101 may identify a voltage (V1) at an output terminal of the converter 516 and an input terminal of the inverter 514 as the target voltage. The wireless power transmission device 101 may identify a peak-to-peak value based on the driving voltage.

As described above, the wireless power transmission device 101 may include a capacitor 520 having one end 521 connected to the input terminal of the inverter 514 and the output terminal of the converter 516.

According to an embodiment, the wireless power transmission device 101 may identify the voltage of the other end 522 of the capacitor 520 as the target voltage. For example, the voltage at the one end 521 of the capacitor 520 may be the driving voltage (for example, the voltage provided from the converter to the inverter) and the voltage at the other end 522 of the capacitor 520 may be the voltage identified by the driving voltage (for example, the voltage provided from the converter 516 to the inverter 514) passing through the capacitor 520. The wireless power transmission device 101 may identify the peak-to-peak value based on the voltage at the other end 522 of the capacitor 520.

As described above, the wireless power transmission device 101 may include the ADC 511 electrically connected to the other end 522 of the capacitor 520.

According to an embodiment, the wireless power transmission device 101 may identify the peak-to-peak value based on the voltage at the other end 522 of the capacitor 520 converted using the ADC 511.

According to an embodiment, the wireless power transmission device 101 may, for example, identify the voltage of the capacitor 531 or the voltage of the capacitor 533 as the target voltage and identify the peak-to-peak value based on the voltage of the capacitor 531 or the voltage of the capacitor 533.

In operation 703, according to an embodiment, the wireless power transmission device 101 may compare the identified peak-to-peak value with a reference value (for example, a first reference value and/or a second reference value). For example, the wireless power transmission device 101 may compare the identified peak-to-peak value with the first reference value. For example, the wireless power transmission device 101 may compare the identified peak-to-peak value with the second reference value. For example, the wireless power transmission device 101 may compare the identified peak-to-peak value with the first reference value and the second reference value. For example, the "first reference value" may be a reference value (for example, 100 mV) making audible noise of the capacitor (for example, at least one capacitor within the wireless power transmission device 101 or at least one capacitor within the wireless power reception device 103) be larger than or equal to a predetermined level (for example, 25 phon). The "second reference value" may be a reference value (for example, 30 mV) related to a minimum level (for example, 150 mV P-P of a guarantee level of the demodulation voltage of in-band communication) at which stability of in-band communication between the wireless power transmission device 101 and the wireless power reception device 103 is guaranteed. The second reference value may be smaller than the first reference value. For example, the first reference value may be 100 mV and the second reference value may be 30 mV, but this is only an example, and there is no limit in the first reference value, the second reference value, a predetermined level of audible noise, and the minimum level at which stability of in-band communication is guaranteed.

In operation 705, according to an embodiment, the wireless power transmission device 101 may be configured to perform at least one operation for providing a first packet to the wireless power reception device 103 based on the peak-to-peak value identified as being larger than the first reference value. The "first packet" may be a packet for reducing modulation depth of the wireless power reception device 103. The control of the modulation depth of the wireless power reception device 103 has been described with reference to FIGS. 6A, 6B, and 6C. For example, the first packet may be a packet configured to cause reduction in the number of switches used for amplitude modulation of the wireless power reception device 103. The reduction in the number of switches may be reduction in the number of switches in the on state, but there is no limit therein. For example, the wireless power reception device 103 may perform at least one operation for reducing modulation depth of the wireless power reception device 103 based on reception of the first packet from the wireless power transmission device 101. For example, the wireless power reception device 103 may perform an operation of reducing the number of switches (for example, the first switch 624, the second switch 625, the third switch 622, the fourth switch 623, the fifth switch 632, and/or the sixth switch 634 of FIG. 6B) used for amplitude modulation of the wireless power reception device 103 based on reception of the first packet from the wireless power transmission device 101. For example, the wireless power reception device 103 may control resistance values of the variable resistors (for example, the first variable resistor 642 and/or the second variable resistor 644 of FIG. 6C) used for amplitude modulation of the wireless power reception device 103 based on reception of the first packet from the wireless power transmission device 101.

According to an embodiment, the wireless power transmission device 101 may perform FSK modulation for AC power applied to the transmission coil 512 as at least one operation for providing the first packet. For example, the wireless power transmission device 101 may control the inverter 514 to modulate a frequency of the AC power applied to the transmission coil 512 based on the first packet as at least one operation for providing the first packet.

In operation 707, according to an embodiment, the wireless power transmission device 101 may perform at least one operation for maintaining modulation depth of the wireless power reception device 103 based on the identified peak-to-peak value being equal to or smaller than the first reference value and larger than or equal to the second reference value. For example, the wireless power transmission device 101 may not provide the packet to the wireless power reception device 103. For example, the wireless power transmission device 101 may be configured to refrain from performing the operation for providing the packet related to the control of modulation depth of the wireless power reception device 103 based on the identified peak-to-peak value being equal to or smaller than the first reference value and larger than or equal to the second reference value. According to an embodiment, the wireless power transmission device 101 may transmit the packet for maintaining modulation depth of the wireless power reception device 103 to the wireless power reception device 103 based on the identified peak-to-peak value being equal to or smaller than the first reference value and larger than or equal to the second reference value.

In operation 709, according to an embodiment, the wireless power transmission device 101 may be configured to perform at least one operation for providing a second packet to the wireless power reception device 103 based on the identified peak-to-peak value being smaller than the second reference value which is smaller than the first reference value. The "second packet" may be a packet for increasing modulation depth of the wireless power reception device 103. For example, the second packet may be a packet configured to cause an increase in the number of switches used for amplitude modulation of the wireless power reception device 103. The increase in the number of switches may be an increase in the number of switches in the on state, but there is no limit therein. For example, the wireless power reception device 103 may perform at least one operation for increasing modulation depth of the wireless power reception device 103 based on reception of the second packet from the wireless power transmission device 101. For example, the wireless power reception device 103 may perform an operation of increasing the number of switches (for example, the first switch 624, the second switch 625, the third switch 622, the fourth switch 623, the fifth switch 632, and/or the sixth switch 634 of FIG. 6B) used for amplitude modulation of the wireless power reception device 103 based on reception of the second packet from the wireless power transmission device 101. For example, the wireless power reception device 103 may control resistance values of the variable resistors (for example, the first variable resistor 642 and/or the second variable resistor 644 of FIG. 6C) used for amplitude modulation of the wireless power reception device 103 based on reception of the second packet from the wireless power transmission device 101.

According to an embodiment, the wireless power transmission device 101 may perform FSK modulation for AC power applied to the transmission coil 512 as at least one operation for providing the second packet. For example, the wireless power transmission device 101 may control the inverter 514 to modulate a frequency of the AC power applied to the transmission coil 512 based on the second packet as at least one operation for providing the second packet.

FIG. 8 is a diagram illustrating a packet according to an embodiment.

The wireless power reception device 101 may provide a packet having a format illustrated in FIG. 8 to the wireless power reception device 103 through in-band communication according to FSK. For example, the wireless power reception device 101 may provide a first packet (for example, a packet for reducing modulation depth of the wireless power reception device 103) or a second packet (for example, a packet for increasing modulation depth of the wireless power reception device 103) to the wireless power reception device 103. For example, the wireless power reception device 101 may provide the first packet (for example, the packet for reducing modulation depth of the wireless power reception device 103) or the second packet (for example, the packet for increasing modulation depth of the wireless power reception device 103) to the wireless power reception device 103 by using a proprietary header (for example, 0x1E, 0x1F, 0x2E, or 0x2F) of FIG. 8. However, there is no limit in the packet format of the first packet and the second packet.

FIG. 9 is a block diagram illustrating an example electronic device in a network environment according to embodiments.

Referring to FIG. 9, the electronic device 901 in the network environment 900 may communicate with an electronic device 902 via a first network 998 (e.g., a short-range wireless communication network), or an electronic device 904 or a server 908 via a second network 999 (e.g., a long-range wireless communication network). According to an embodiment, the electronic device 901 may communicate with the electronic device 904 via the server 908. According to an embodiment, the electronic device 901 may include a processor 920, memory 930, an input module 950, a sound output module 955, a display module 960, an audio module 970, a sensor module 976, an interface 977, a connecting terminal 978, a haptic module 979, a camera module 980, a power management module 988, a battery 989, a communication module 990, a subscriber identification module (SIM) 996, or an antenna module 997. In an embodiments, at least one of the components (e.g., the connecting terminal 978) may be omitted from the electronic device 901, or one or more other components may be added to the electronic device 901. In an embodiments, some of the components (e.g., the sensor module 976, the camera module 980, or the antenna module 997) may be implemented as a single component (e.g., the display module 960).

The processor 920 may execute, for example, software (e.g., a program 940) to control at least one other component (e.g., a hardware or software component) of the electronic device 901 coupled with the processor 920, and may perform various data processing or computation. According to an embodiment, as at least part of the data processing or computation, the processor 920 may store a command or data received from another component (e.g., the sensor module 976 or the communication module 990) in volatile memory 932, process the command or the data stored in the volatile memory 932, and store resulting data in non-volatile memory 934. According to an embodiment, the processor 920 may include a main processor 921 (e.g., a central processing unit (CPU) or an application processor (AP)), or an auxiliary processor 923 (e.g., a graphics processing unit (GPU), a neural processing unit (NPU), an image signal processor (ISP), a sensor hub processor, or a communication processor (CP)) that is operable independently from, or in conjunction with, the main processor 921. For example, when the electronic device 901 includes the main processor 921 and the auxiliary processor 923, the auxiliary processor 923 may be adapted to consume less power than the main processor 921, or to be specific to a specified function. The auxiliary processor 923 may be implemented as separate from, or as part of, the main processor 921.

The auxiliary processor 923 may control, for example, at least some of functions or states related to at least one component (e.g., the display module 960, the sensor module 976, or the communication module 990) among the components of the electronic device 901, instead of the main processor 921 while the main processor 921 is in an inactive (e.g., sleep) state, or together with the main processor 921 while the main processor 921 is in an active (e.g., executing an application) state. According to an embodiment, the auxiliary processor 923 (e.g., an image signal processor or a communication processor) may be implemented as part of another component (e.g., the camera module 980 or the communication module 990) functionally related to the auxiliary processor 923. According to an embodiment, the auxiliary processor 923 (e.g., the neural processing unit) may include a hardware structure specified for artificial intelligence model processing. An artificial intelligence model may be generated by machine learning. Such learning may be performed, e.g., by the electronic device 901 where the artificial intelligence is performed or via a separate server (e.g., the server 908). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 930 may store various data used by at least one component (e.g., the processor 920 or the sensor module 976) of the electronic device 901. The various data may include, for example, software (e.g., the program 940) and input data or output data for a command related thereto. The memory 930 may include the volatile memory 932 or the non-volatile memory 934.

The program 940 may be stored in the memory 930 as software, and may include, for example, an operating system (OS) 942, middleware 944, or an application 946.

The input module 950 may receive a command or data to be used by another component (e.g., the processor 920) of the electronic device 901, from the outside (e.g., a user) of the electronic device 901. The input module 950 may include, for example, a microphone, a mouse, a keyboard, a key (e.g., a button), or a digital pen (e.g., a stylus pen).

The sound output module 955 may output sound signals to the outside of the electronic device 901. The sound output module 955 may include, for example, a speaker or a receiver. The speaker may be used for general purposes, such as playing multimedia or playing record. The receiver may be used for receiving incoming calls. According to an embodiment, the receiver may be implemented as separate from, or as part of, the speaker.

The display module 960 may visually provide information to the outside (e.g., a user) of the electronic device 901. The display module 960 may include, for example, a display, a hologram device, or a projector and control circuitry to control a corresponding one of the display, hologram device, and projector. According to an embodiment, the display module 960 may include a touch sensor adapted to detect a touch, or a pressure sensor adapted to measure the intensity of force incurred by the touch.

The audio module 970 may convert a sound into an electrical signal and vice versa. According to an embodiment, the audio module 970 may obtain the sound via the input module 950, or output the sound via the sound output module 955 or an external electronic device (e.g., an electronic device 902 (e.g., a speaker or a headphone)) directly or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to an embodiment, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly or wirelessly. According to an embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to an embodiment, the connecting terminal 978 may include, for example, an HDMI connector, a USB connector, an SD card connector, or an audio connector (e.g., a headphone connector).

The haptic module 979 may convert an electrical signal into a mechanical stimulus (e.g., a vibration or a movement) or electrical stimulus which may be recognized by a user via his tactile sensation or kinesthetic sensation. According to an embodiment, the haptic module 979 may include, for example, a motor, a piezoelectric element, or an electric stimulator.

The camera module 980 may capture a still image or moving images. According to an embodiment, the camera module 980 may include one or more lenses, image sensors, image signal processors, or flashes.

The power management module 988 may manage power supplied to the electronic device 901. According to an embodiment, the power management module 988 may be implemented as at least part of, for example, a power management integrated circuit (PMIC).

The battery 989 may supply power to at least one component of the electronic device 901. According to an embodiment, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the application processor (AP)) and supports a direct (e.g., wired) communication or a wireless communication. According to an embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device 904 via the first network 998 (e.g., a short-range communication network, such as Bluetooth™, wireless-fidelity (Wi-Fi) direct, or infrared data association (IrDA)) or the second network 999 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify or authenticate the electronic device 901 in a communication network, such as the first network 998 or the second network 999, using subscriber information (e.g., international mobile subscriber identity (IMSI)) stored in the subscriber identification module 996.

The wireless communication module 992 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 992 may support a high-frequency band (e.g., the mmWave band) to achieve, e.g., a high data transmission rate. The wireless communication module 992 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 992 may support various requirements specified in the electronic device 901, an external electronic device (e.g., the electronic device 904), or a network system (e.g., the second network 999). According to an embodiment, the wireless communication module 992 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 997 may transmit or receive a signal or power to or from the outside (e.g., the external electronic device) of the electronic device 901. According to an embodiment, the antenna module 997 may include an antenna including a radiating element composed of or including a conductive material or a conductive pattern formed in or on a substrate (e.g., a printed circuit board (PCB)). According to an embodiment, the antenna module 997 may include a plurality of antennas (e.g., array antennas). In such a case, at least one antenna appropriate for a communication scheme used in the communication network, such as the first network 998 or the second network 999, may be selected, for example, by the communication module 990 from the plurality of antennas. The signal or the power may then be transmitted or received between the communication module 990 and the external electronic device via the selected at least one antenna. According to an embodiment, another component (e.g., a radio frequency integrated circuit (RFIC)) other than the radiating element may be additionally formed as part of the antenna module 997.

According to embodiments, the antenna module 997 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 901 and the external electronic device 904 via the server 908 coupled with the second network 999. Each of the external electronic devices 902 or 904 may be a device of a same type as, or a different type, from the electronic device 901. According to an embodiment, all or some of operations to be executed at the electronic device 901 may be executed at one or more of the external electronic devices 902, 904, or 908.

For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, mobile edge computing (MEC), or client-server computing technology may be used, for example. The electronic device 901 may provide ultra low-latency services using, e.g., distributed computing or mobile edge computing. In an embodiment, the external electronic device 904 may include an internet-of-things (IoT) device. The server 908 may be an intelligent server using machine learning and/or a neural network. According to an embodiment, the external electronic device 904 or the server 908 may be included in the second network 999. The electronic device 901 may be applied to intelligent services (e.g., smart home, smart city, smart car, or healthcare) based on 5G communication technology or IoT-related technology.

It may be understood by those skilled in the art that example embodiments of the disclosure can be organically applied within an applicable range. For example, it may be understood by those skilled in the art that at least some operations of the embodiments of the disclosure may be omitted and applied, and at least some operation of other embodiments different from at least some operations of the embodiments may be organically connected and applied.

According to the performance of in-band communication, the current and/or the voltage applied to the transmission coil of the wireless power transmission device may be changed. Meanwhile, when a degree of the change (for example, the peak-to-peak value) is relatively large, a degree of the change in the voltage applied to at least one capacitor included in the wireless power transmission device may also be relatively large. The change in the voltage in at least one capacitor may cause charging and discharging in at least one capacitor. According to charging and discharging of at least one capacitor, dielectrics within the at least one capacitor may expand and/or contract. Expansion and contraction of the dielectric may generate vibration. The generated vibration may be transmitted to neighboring components and may be heard by the user as noise. For example, a modulation frequency according to an ASK modulation scheme may be 2 kHz based on the Qi standard. Expansion and contraction of the dielectric according to the corresponding modulation may also have the corresponding modulation frequency and the modulation frequency may be included in an audible frequency band (for example, 2 to 20000 Hz), and thus audible noise may be generated.

The capacitors included in the wireless power reception device may also expand and contract according to modulation, and the expansion and the contraction may be heard by the user as audible noise.

According to an embodiment, a wireless power transmission device (for example, the wireless power transmission device 101) for wirelessly transmitting power to a wireless power reception device (for example, the wireless power reception device 103) may include: a transmission coil (for example, the transmission coil 512); a converter (for example, the converter 516) configured to output a driving voltage, an inverter (for example, the inverter 514) configured to output AC power to the transmission coil (for example, the transmission coil 512) using the driving voltage, and a controller (for example, the controller 510). The controller (for example, the controller 510) may be configured to identify a first voltage at one point within the wireless power transmission device (for example, the wireless power transmission device 101) while the power is wirelessly transmitted through the transmission coil (for example, the transmission coil 512). The controller (for example, the controller 510) may be configured to perform at least one operation for providing a first packet for reduction in modulation depth of the wireless power reception device (for example, the wireless power reception device 103) to the wireless power reception device (for example, the wireless power reception device 103), based on a peak-to-peak value, which is identified based on the first voltage at the point therein, being larger than a first reference value.

According to an embodiment, the first voltage may be the driving voltage. The controller (for example, the controller 510) may be configured to perform at least one operation for providing the first packet, based on the peak-to-peak value being identified as larger than the first reference value, based on the driving voltage.

According to an embodiment, the wireless power transmission device (for example, the wireless power transmission device 101) may further include a capacitor (for example, the capacitor 520) having one end connected to an input terminal of the inverter (for example, the inverter 514) and an output terminal of the converter (for example, the converter 516). The first voltage may be a voltage at the other end of the capacitor (for example, the capacitor 520). The controller (for example, the controller 510) may be configured to perform at least one operation for providing the first packet, based on the peak-to-peak value being identified as larger than the first reference value, based on the voltage at the other end of the capacitor (for example, the capacitor 520).

According to an embodiment, the wireless power transmission device (for example, the wireless power transmission device 101) may include an analog-to-digital converter (ADC) (for example, the ADC 511) electrically connected to the other end of the capacitor (for example, the capacitor 520). The controller (for example, the controller 510) may be configured to identify the peak-to-peak value, based on the first voltage converted using the ADC (for example, the ADC 511). The controller (for example, the controller 510) may be configured to perform at least one operation for providing the first packet, based on the peak-to-peak value being identified as larger than the first reference value.

According to an embodiment, the controller (for example, the controller 510) may be configured to perform at least one operation for providing a second packet for an increase in the modulation depth to the wireless power reception device (for example, the wireless power reception device 103), based on the peak-to-peak value being smaller than a second reference value, which is smaller than the first reference value.

According to an embodiment, the controller (for example, the controller 510) may be configured to refrain from performing an operation for providing a packet related to control of the modulation depth, based on the peak-to-peak value being equal to or smaller than the first reference value and larger than or equal to the second reference value.

According to an embodiment, the controller (for example, the controller 510) may be configured to modulate a frequency of the AC power applied to the transmission coil (for example, the transmission coil 512) as at least one operation for providing the first packet.

According to an embodiment, the first packet may be configured to cause reduction in a number of switches (for example, the first switch 624, the second switch 625, the third switch 622, the fourth switch 623, the fifth switch 632, and/or the sixth switch 634) used for amplitude modulation of the wireless power reception device (for example, the wireless power reception device 103).

According to an embodiment, a method of operating a wireless power transmission device (for example, the wireless power transmission device 101) for wirelessly transmitting power to a wireless power reception device (for example, the wireless power reception device 103) may include an operation of providing a driving voltage to an inverter (for example, the inverter 514) of the wireless power transmission device (for example, the wireless power transmission device 101) by a converter (for example, the converter 516) of the wireless power transmission device (for example, the wireless power transmission device 101). The method may include an operation of applying AC power to a transmission coil (for example, the transmission coil 512) of the wireless power transmission device (for example, the wireless power transmission device 101) by the inverter (for example, the inverter 514) using the driving voltage. The method may include an operation of identifying a first voltage at one point within the wireless power transmission device (for example, the wireless power transmission device 101) while the power is wirelessly transmitted through the transmission coil (for example, the transmission coil 512). The method may include an operation of performing at least one operation for providing a first packet for reduction in modulation depth of the wireless power reception device (for example, the wireless power reception device 103) to the wireless power reception device (for example, the wireless power reception device 103), based on a peak-to-peak value being identified as larger than a first reference value, based on the first voltage at the one point therein.

According to an embodiment, the first voltage may be the driving voltage. The operation of performing the at least one operation for providing the first packet may include an operation of performing at least one operation for providing the first packet, based on the peak-to-peak value being identified as larger than the first reference value, based on the driving voltage 520).

According to an embodiment, the wireless power transmission device (101) may include a capacitor (for example, the capacitor 520) having one end connected to an input terminal of the inverter (for example, the inverter 514) and an output terminal of the converter (for example, the converter 516). The first voltage may be a voltage at the other end of the capacitor (for example, the capacitor 520). The operation of performing the at least one operation for providing the first packet may include an operation of performing the at least one operation for providing the first packet, based on the peak-to-peak value being identified as larger than the first reference value, based on the voltage at the other end of the capacitor (for example, the capacitor 520).

According to an embodiment, the wireless power transmission device (for example, the wireless power transmission device 101) may include an analog-to-digital converter (ADC) (for example, the ADC 511) electrically connected to the other end of the capacitor (for example, the capacitor 520). The operation of identifying the first voltage may include an operation of identifying the peak-to-peak value, based on the first voltage converted using the ADC (for example, the ADC 511). The operation of performing the at least one operation for providing the first packet may include an operation of performing the at least one operation for providing the first packet, based on the identified peak-to-peak value being larger than the first reference value.

According to an embodiment, the method may include an operation of performing at least one operation for providing a second packet for an increase in the modulation depth to the wireless power reception device (for example, the wireless power reception device 103), based on the peak-to-peak value being smaller than a second reference value, which is smaller than the first reference value.

According to an embodiment, the method may include an operation of refraining from performing an operation for providing a packet related to control of the modulation depth, based on the peak-to-peak value being equal to or smaller than the first reference value and larger than or equal to the second reference value.

According to an embodiment, the at least one operation for providing the first packet may include an operation of modulating a frequency of the AC power applied to the transmission coil (for example, the transmission coil 512).

According to an embodiment, the first packet may be configured to cause reduction in a number of switches (for example, the first switch 624, the second switch 625, the third switch 622, the fourth switch 623, the fifth switch 632, and/or the sixth switch 634) used for amplitude modulation of the wireless power reception device (for example, the wireless power reception device 103).

According to an embodiment, a non-transitory computer-readable recording medium storing instructions configured to perform at least one operation by a controller (for example, the controller 510) of a wireless power transmission device (for example, the wireless power transmission device 101) for wirelessly transmitting power to a wireless power reception device (for example, the wireless power reception device 103) may include an operation of providing a driving voltage to an inverter (for example, the inverter 514) of the wireless power transmission device (for example, the wireless power transmission device 101) by a converter (for example, the converter 516) of the wireless power transmission device (for example, the wireless power transmission device 101). The at least one operation may include an operation of applying AC power to a transmission coil (for example, the transmission coil 512) of the wireless power transmission device (for example, the wireless power transmission device 101) by the inverter (for example, the inverter 514) using the driving voltage. The at least one operation may include an operation of identifying a first voltage at one point within the wireless power transmission device (for example, the wireless power transmission device 101) while the power is wirelessly transmitted through the transmission coil (for example, the transmission coil 512). The at least one operation may include an operation of performing at least one operation for providing a first packet for reduction in modulation depth of the wireless power reception device (for example, the wireless power reception device 103) to the wireless power reception device (for example, the wireless power reception device 103), based on a peak-to-peak value being identified to be larger than a first reference value, based on the first voltage.

According to an embodiment, when a change in the voltage at one point within the wireless power transmission device (for example, the wireless power transmission device 101) according to in-band communication satisfies a predetermined condition, a method of transmitting and receiving a packet for controlling modulation depth of the wireless power reception device (for example, the wireless power reception device 103) may be provided.

According to an embodiment, through the control of modulation depth of the wireless power reception device (for example, the wireless power reception device 103) based on transmission of a packet from the wireless power transmission device (for example, the wireless power transmission device 101) to the wireless power reception device (for example, the wireless power reception device 103), the generation of audible noise due to expansion and contraction of dielectrics within capacitors (for example, 212, 222, 223, 241, 243, 261, 262, 263, 264, 520, 531, 532, 533, 614, 615, 612, 613, 631, 633, 641, and 643) may be suppressed or stability of in-band communication may increase.

The electronic device according to embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and do not limit the components in any other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Embodiments as set forth herein may be implemented as software (e.g., the program) including one or more instructions that are stored in a storage medium (e.g., internal memory or external memory) that is readable by a machine (e.g., the wireless power transmission device 100). For example, a processor (e.g., the processor 201) of the machine (e.g., the wireless power transmission device 100) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium, where the term "non-transitory" simply refers to the storage medium as being a tangible device, and does not include a signal (e.g., an electromagnetic wave), but this term does not differentiate between data being semi-permanently stored in the storage medium and data being temporarily stored in the storage medium.

According to an embodiment, a method according to embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to embodiments, each component (e.g., a module or a program) of the above-described components may include a single entity or multiple entities, and some of the multiple entities may be separately disposed in different components. According to embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those of ordinary skill in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A wireless power transmitter for wirelessly transmitting power to a wireless power receiver, the wireless power transmitter comprising:
    a transmission coil;
    a converter configured to output a driving voltage;
    an inverter configured to output AC power to the transmission coil using the driving voltage; and
    a controller, wherein the controller is configured to:
measure a first voltage at one point within the wireless power transmitter while the power is wirelessly transmitted through the transmission coil,
identify a peak-to-peak value based on a difference between a maximum value and a minimum value of the first voltage, and
in accordance with the peak-to-peak value being greater than a first reference value, perform at least one operation for providing a first packet for reduction in modulation depth of the wireless power receiver to the wireless power receiver.

2. The wireless power transmitter of claim 1, wherein the first voltage is the driving voltage, and
the controller is configured to perform at least one operation for providing the first packet, based on the peak-to-peak value identified based on the difference between the maximum value and the minimum value of the driving voltage being greater than the first reference value.

3. The wireless power transmitter of claim 1, further comprising a capacitor having one end connected to an input terminal of the inverter and an output terminal of the converter,
wherein the first voltage is a voltage at another end of the capacitor, and
the controller is configured to perform at least one operation for providing the first packet, based on the peak-to-peak value identified based on the difference between the maximum value and the minimum value of the voltage at the other end of the capacitor being greater than the first reference value.

4. The wireless power transmitter of claim 3, wherein the controller further comprises an analog-to-digital converter (ADC) electrically connected to the other end of the capacitor, and
the controller is configured to:
identify the peak-to-peak value, based on the difference between the maximum value and the minimum value of the first voltage converted using the ADC, and
perform at least one operation for providing the first packet, based on the identified peak-to-peak value being greater than the first reference value.

5. The wireless power transmitter of claim 1, wherein the controller is configured to perform at least one operation for providing a second packet for an increase in modulation depth to the wireless power receiver, based on the peak-to-peak value being smaller than a second reference value, which is smaller than the first reference value.

6. The wireless power transmitter of claim 5, wherein the controller is configured to refrain from performing an operation for providing a packet related to control of the modulation depth, based on the peak-to-peak value being equal to or smaller than the first reference value and greater than or equal to the second reference value.

7. The wireless power transmitter of claim 1, wherein the controller is configured to modulate a frequency of the AC power applied to the transmission coil as the at least one operation for providing the first packet.

8. The wireless power transmitter of claim 1, wherein the first packet is configured to cause reduction in a number of switches used for amplitude modulation of the wireless power receiver.

9. A method of operating a wireless power transmitter for wirelessly transmitting power to a wireless power receiver, the method comprising:
providing a driving voltage to an inverter of the wireless power transmitter by a converter of the wireless power transmitter;
applying AC power to a transmission coil of the wireless power transmitter by the inverter using the driving voltage;
measuring a first voltage at one point within the wireless power transmitter while the power is wirelessly transmitted through the transmission coil;
identifying a peak-to-peak value based on a difference between a maximum value and a minimum value of the first voltage; and
in accordance with the peak-to-peak value being greater than a first reference value, performing at least one operation for providing a first packet for reduction in modulation depth of the wireless power receiver to the wireless power receiver.

10. The method of claim 9, wherein the first voltage is the driving voltage, and
the performing of the at least one operation for providing the first packet comprises performing at least one operation for providing the first packet, based on the peak-to-peak value identified based on the difference between the maximum value and the minimum value of the driving voltage being greater than the first reference value.

11. The method of claim 9, wherein the wireless power transmitter further comprises a capacitor having one end connected to an input terminal of the inverter and an output terminal of the converter,
the first voltage is a voltage at another end of the capacitor, and
the performing of the at least one operation for providing the first packet comprises performing at least one operation for providing the first packet, based on the peak-to-peak value identified based on the difference between the maximum value and the minimum value of the voltage at the other end of the capacitor being greater than the first reference value.

12. The method of claim 11, wherein the wireless power transmitter further comprises an analog-to-digital converter (ADC) electrically connected to the other end of the capacitor,
the identifying of the peak-to-peak value comprises identifying the peak-to-peak value, based on the difference between the maximum value and the minimum value of the first voltage converted using the ADC, and
the performing of the at least one operation for providing the first packet comprises performing the at least one operation for providing the first packet, based on the identified peak-to-peak value being greater than the first reference value.

13. The method of claim 9, further comprising performing at least one operation for providing a second packet for an increase in modulation depth to the wireless power receiver, based on the peak-to-peak value being smaller than a second reference value, which is smaller than the first reference value.

14. The method of claim 13, further comprising refraining from performing an operation for providing a packet related to control of the modulation depth, based on the peak-to-peak value being equal to or smaller than the first reference value and greater than or equal to the second reference value.

15. The method of claim 9, wherein the at least one operation for providing the first packet comprises modulating a frequency of the AC power applied to the transmission coil.

16. The method of claim 9, wherein the first packet is configured to cause reduction in a number of switches used for amplitude modulation of the wireless power receiver.

* * * * *